(12) United States Patent
Takasaki

(10) Patent No.: US 7,240,262 B2
(45) Date of Patent: Jul. 3, 2007

(54) SCAN-PATH CIRCUIT, LOGIC CIRCUIT INCLUDING THE SAME, AND METHOD FOR TESTING INTEGRATED CIRCUIT

(75) Inventor: Tomoya Takasaki, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 223 days.

(21) Appl. No.: 10/861,306

(22) Filed: Jun. 4, 2004

(65) Prior Publication Data
US 2004/0250186 A1 Dec. 9, 2004

(30) Foreign Application Priority Data
Jun. 6, 2003 (JP) .............................. 2003-162913

(51) Int. Cl.
*G01R 31/28* (2006.01)
(52) U.S. Cl. .................. 714/726; 714/734; 714/30
(58) Field of Classification Search .................. None
See application file for complete search history.

(56) References Cited

U.S. PATENT DOCUMENTS

| | | | |
|---|---|---|---|
| 4,804,864 A | | 2/1989 | Spence |
| 5,075,570 A | | 12/1991 | Shewchuck et al. |
| 5,406,216 A | * | 4/1995 | Millman et al. ............ 327/202 |
| 5,574,731 A | * | 11/1996 | Qureshi ....................... 714/726 |
| 5,881,067 A | * | 3/1999 | Narayanan et al. ......... 714/726 |
| 5,920,575 A | * | 7/1999 | Gregor et al. ............... 714/726 |
| 5,949,265 A | | 9/1999 | Bracchitta et al. |
| 6,046,617 A | | 4/2000 | Hoeld |
| 6,314,539 B1 | * | 11/2001 | Jacobson et al. ........... 714/727 |
| 6,567,943 B1 | * | 5/2003 | Barnhart et al. ............. 714/727 |

(Continued)

FOREIGN PATENT DOCUMENTS

EP 0508673 A2 4/1992

(Continued)

OTHER PUBLICATIONS

Yuejian Wu, "Diagnosis of Scan Chain Failures", Nov. 4, 1998, IEEE Symposium on Defect and Fault Tolerance in VLSI Systems, pp. 217-222.*

(Continued)

*Primary Examiner*—Albert Decady
*Assistant Examiner*—John P. Trimmings
(74) *Attorney, Agent, or Firm*—Harness, Dickey & Pierce, PLC

(57) ABSTRACT

A scan-path circuit is made up of cascaded flip-flops which are input/output circuits of a combinational logic circuit. In a logic circuit 21 which adopts a scan design test technique for simplifying a test of the same by serially shifting a test result through the flip-flops, selectors for directly connecting inputs of the respective flip-flops of the scan-path circuit to a scan input are provided. After causing all flip-flops to have identical values (either "0" or "1"), the values are shifted and outputted so that the location of a failure is specified. With this, the maximum period of time required by the test does not exceed the total of clocks for the shifting through all stages and one more stage. Thus, in addition to the checking of the presence of a failure, the location of a failure is, if necessary, specified in a short period of time.

9 Claims, 5 Drawing Sheets

U.S. PATENT DOCUMENTS

| | | | |
|---|---|---|---|
| 6,694,454 B1 * | 2/2004 | Stanley | 714/30 |
| 6,785,855 B2 * | 8/2004 | Zhang et al. | 714/731 |
| 7,010,735 B2 * | 3/2006 | Motika et al. | 714/726 |
| 7,039,843 B2 * | 5/2006 | Zhang | 714/726 |
| 2001/0043496 A1 | 11/2001 | Cairns et al. | |
| 2002/0116674 A1 * | 8/2002 | Schmid | 714/724 |
| 2003/0196179 A1 * | 10/2003 | Langford, II | 716/2 |
| 2004/0111658 A1 * | 6/2004 | Natsume | 714/752 |

FOREIGN PATENT DOCUMENTS

| | | |
|---|---|---|
| JP | 2-10178 | 1/1990 |

OTHER PUBLICATIONS

European Search Report dated Aug. 2, 2006.

* cited by examiner

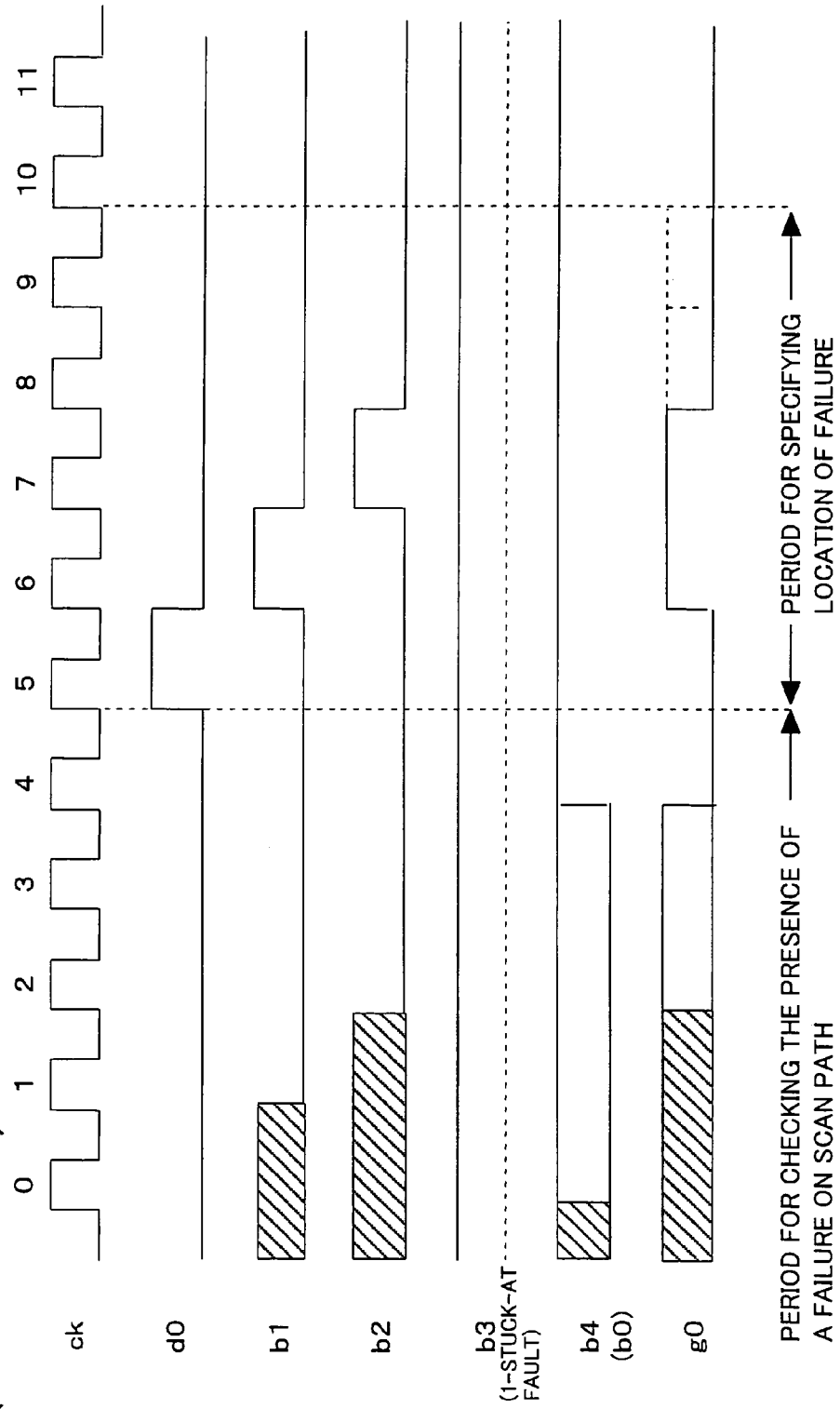

SCAN-PATH CIRCUIT, LOGIC CIRCUIT INCLUDING THE SAME, AND METHOD FOR TESTING INTEGRATED CIRCUIT

This Nonprovisional application claims priority under 35 U.S.C. § 119(a) on Patent Application No. 2003/162913 filed in Japan on Jun. 6, 2003, the entire contents of which are hereby incorporated by reference.

FIELD OF THE INVENTION

The present invention relates to (i) a scan-path circuit included in a scan-design logic circuit, (ii) the scan-design logic circuit, and (iii) a method for testing an integrated circuit including the logic circuit.

BACKGROUND OF THE INVENTION

Recent upsizing of integrated circuits have made it further difficult to carry out a test for detecting failures in manufactured circuits. In order to solve this problem, a scan design (test) technique is adopted for designing circuits. A logic circuit in an integrated circuit is basically made up of a sequential circuit and a combinational circuit. According to the scan design technique, inputs and outputs to/from all flip-flops constituting the sequential circuit are connected to the combinational circuit, and also serially connected to each other so as to constitute a scan path. In this state of things, a data pattern is set in each flop—flop, a clock is supplied thereto, data is supplied from the combinational circuit to the flip-flops, and consequently the sets of data are serially fetched out. In this manner, functions as a circuit are tested. This test is useful for examining various patterns. In this way, values of the respective flip-flops are set and observed through external inputs and outputs and a scan path, i.e. the flip-flops constituting the sequential circuit are seen as external input/output, so that the flip-flops constituting the sequential circuit are tested in the similar manner as a combinational circuit.

FIG. 3 is a block diagram showing circuitry of a logic circuit 1 adopting a typical scan design test technique. This logic circuit 1 is made mainly of a combinational logic circuit 2 and a scan-path circuit 3. In the scan-path circuit 3, all flip-flops f1–fn (hereinafter, n=4 in all figures) of the logic circuit 1 which is subjected to the test are included. In the logic circuit 1, the combinational logic circuit 2 is made up of all circuits other than the sequence elements such as the flip-flop f1–fn. For simplicity, external inputs and outputs connected to the combinational logic circuit 2 are omitted from the figure.

In normal operation, in response to a clock commonly supplied from the outside to input terminal ck, the respective flip-flops f1 through fn fetch signals through respective inputs a1 through an and output the signals through respective outputs b1–bn, in repeating fashion. As a result, an arithmetic process is carried out in the combinational logic circuit 2.

Meanwhile, when conducting the test above, an appropriate signal sequence is supplied to an input terminal d0, and the flip-flops f1 through fn are caused to function as shift registers. Through the outputs b1 through bn, the signal sequence is supplied to the combinational logic circuit 2, thereby causing the combinational logic circuit 2 to carry out an arithmetic process. Subsequently, the result of the arithmetic process is fetched through the inputs a1 through an, and the flip-flops f1 through fn are again caused to function as the shift registers. As a result, the test result is observed through the output terminal b0. Appearing on the input terminal c0 connected to the outside is a control signal for causing the flip-flops f1 through fn to operate as the shift registers.

Prior to this test of the combinational logic circuit 2, the signal appearing on the input terminal c0 causes the flip-flops f1–fn to operate as the shift registers. In this state, if a scan input is supplied from the input terminal d0 to a first-stage output d1, the scan input is serially shifted from the outputs b1 through bn−1 to the inputs d1 through dn−1 in the next stage. Consequently, the presence of a failure on the scan path is identified by checking whether or not the scan input is serially outputted to the outside through the last-stage output bn and the output terminal b0.

In this manner, before being used for testing the combinational logic circuit 2, the flip-flops f1 through fn are subjected to the test. If the test confirms that these flip-flops f1 through fn function properly, the test of the combinational logic circuit 2 is carried out.

However, the above-described technique has such a problem that, although the presence of a failure on the scan path can be identified according to the scan output from the output terminal b0, the location of the failure cannot be identified. For instance, one cannot distinguish a 1-stuck-at fault of the output b3 of the flip-flop f3 from a 1-stuck-at fault of the output b2 of the flip-flop f2, because the scan output on the output terminal is a logical "1" in both cases.

If there is a test for not only identifying the presence of a failure but also specifying the location of the failure, such a test can be utilized for analyzing the failure. More specifically, with such a test, the analysis of the failure is promptly carried out in view of the specified location, and the result of the analysis is swiftly fed back to the design and process, so that the yield and reliability of chips are significantly improved.

Representative examples of failure models are the above-mentioned 1-stuck-at fault which causes a signal line to be stuck (fixed) at high and 0-stuck-at fault which causes a signal line to be stuck (fixed) at low. In many cases, failure models other than these stuck-at faults can be interpreted by the stuck-at fault. The stuck-at fault is thus the most common failure model for logic circuits.

Japanese Laid-Open Patent Application No. 2-10178/1990 (Tokukaihei 2-10178; published on Jan. 12, 1990) is an example of a conventional art for specifying the location of a failure. FIG. 4 is a block diagram showing circuitry of a logic circuit 11 corresponding to this conventional art. Being similar to the above-described logic circuit 1, the logic circuit 11 includes a combinational logic circuit 2 and a scan-path circuit 3. In addition to these members, however, the logic circuit 11 further includes a parity circuit 12. Note that, members having the same functions as those in the logic circuit 1 are given the same numbers, so that the descriptions are omitted for the sake of convenience.

The parity circuit 12 is made up of cascaded XOR gates 1 through gn−1 which perform XOR operation on the respective outputs b1 through bn of the flip-flops f1 through fn constituting the scan path. The location of a failure on the scan path is specified by the timing of the change of a parity output go on the last-stage XOR gate n−1.

FIG. 5 illustrates how a 1-stuck-at fault of the output b3 of the flip-flop f3 is detected. First, a test pattern including only a logical "0" is supplied to the input terminal d0. The shift register does not properly operate with this test pattern, so that, in a cycle 4, a logical "1" appears on the output terminal b0. Next, to the input terminal d0, a test pattern in which a first pattern is a logical "1" and second and subsequent patterns are logical "0" is supplied. Referring to the number of clocks from the supply of the first pattern to the reversal of the logic state, the location of the defected flip-flop f3 is specified.

In FIG. 5, it is determined that high-level is a logical "1" and low-level is a logical "0". In shaded areas, the logic state is indeterminate. As the figure shows, when n=4, clock cycles 0–4 correspond to a test for checking the presence of a failure on the scan path, while cycles 5–9 correspond to a test for specifying the location of the failure. Since the flip-flop f3 is at fault, an abnormal logic state is detected in the cycle 8.

Such a conventional art makes it possible to specify the location of a failure but requires a lot of test cycles for realizing it. That is to say, when n=4, while the presence of a failure is checked with 5 cycles, at least 9 cycles are required for specifying the location of the failure. In this manner, a period of time required by the latter test is substantially twice as much as a period of time required by the former test. This period of time for specifying the location of the failure lengthens as the number of stages in one scan path increases.

SUMMARY OF THE INVENTION

The objective of the present invention is to provide a scan-path circuit which make it possible to quickly specify the location of a failure, a logic circuit including the scan-path circuit, and a method for testing an integrated circuit.

To achieve this objective, a scan-path circuit of the present invention, included in a scan-design logic circuit, comprises: a plurality of flip-flops which are cascaded and constitute a scan path: and input setting means for causing respective inputs of said plurality of flip-flops to have identical values.

According to this arrangement, in a scan-path circuit included in a logic circuit which adopts a scan design test technique for simplifying a test by serially shifting a test result through flip-flops which are input/output circuits of a combinational logic circuit in the logic circuit, input means for causing, before carrying out the test, the inputs of the flip-flops to have identical values (either "0" or "1") is provided, and after setting the values on the inputs as such, the shifting and outputting are carried out so that the location of a failure is specified.

Thus, the maximum period of time required by the test does not exceed the total of clock cycles for the shifting through all stages and one more stage, and only by adding a few terminals for setting values of the inputs, it becomes possible to specify the location of a failure and reduce the number of cycles required for detecting a failure. On this account, the analysis of a failure is carried out with ease. The present invention is particularly effective in the case of a stuck-at fault which causes a value of the flip-flop to be fixed at a particular value.

For a fuller understanding of the nature and advantages of the invention, reference should be made to the ensuing detailed description taken in conjunction with the accompanying drawings.

BRIEF DESCRIPTION OF THE DRAWINGS

FIG. 5 is an waveform chart for describing how a failure is detected in the logic circuit of FIG. 4, taking a 1-stuck-at fault in an output signal line of a third-stage flip-flop as an example.

DESCRIPTION OF THE EMBODIMENTS

Figure 1:
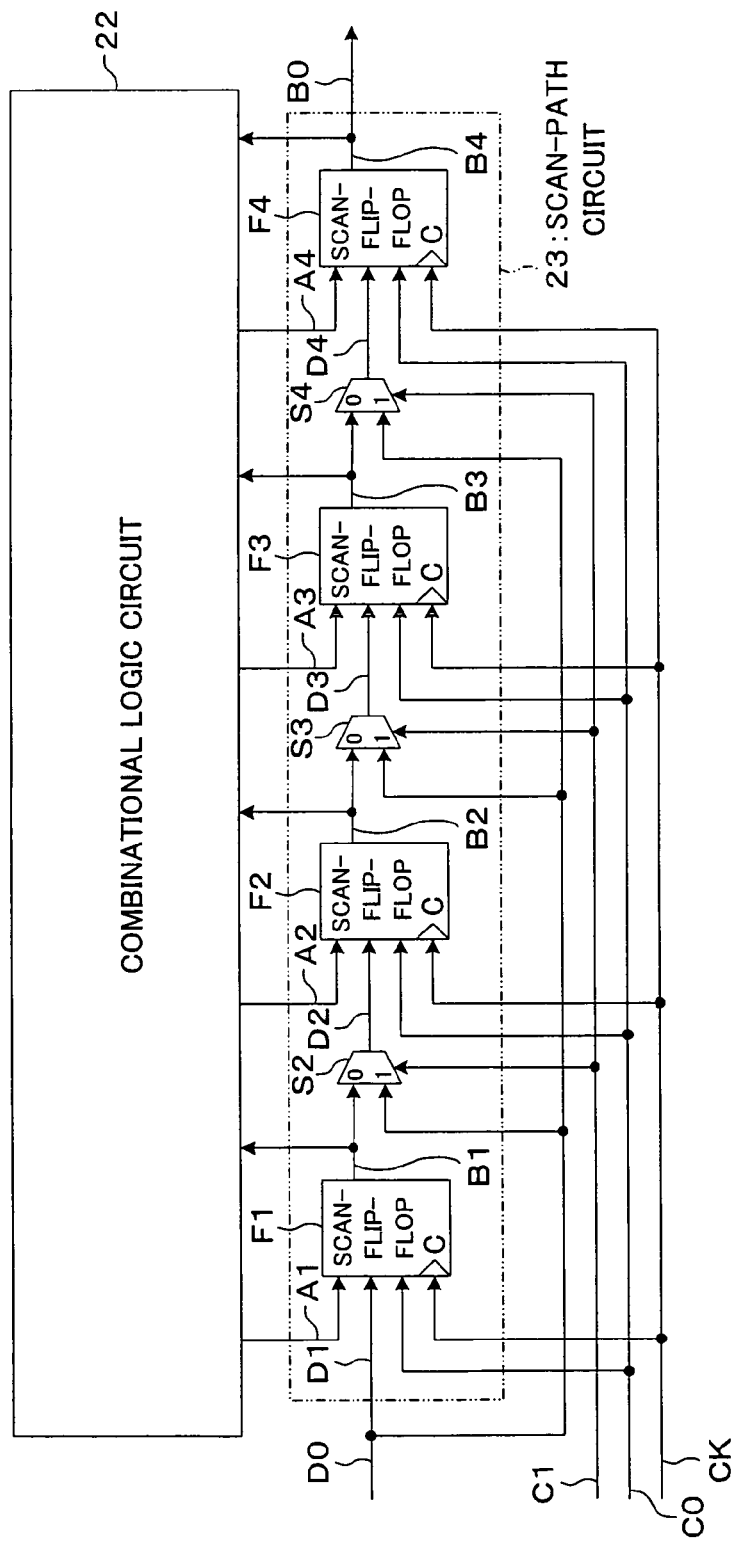
FIG. 1 is a block diagram showing circuitry of a logic circuit adopting a scan design test technique of one embodiment of the present invention.
Figure 2:
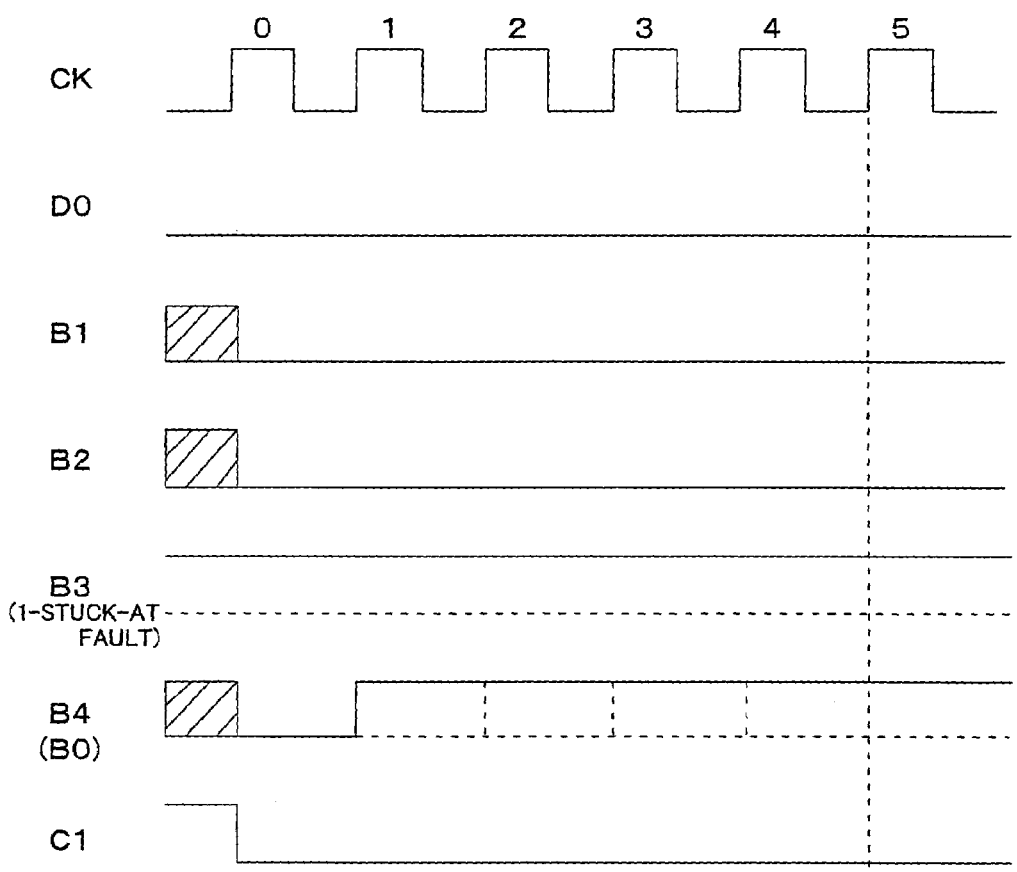
FIG. 2 is an waveform chart for describing how a failure is detected in the logic circuit of FIG. 1, taking a 1-stuck-at fault in an output signal line of a third-stage flip-flop as an example.

The following will describe an embodiment of the present invention in reference to FIGS. 1 and 2.

FIG. 1 is a block diagram showing circuitry of a logic circuit 21 adopting a scan design test technique of the embodiment of the present invention. The logic circuit 21 mainly includes a combinational logic circuit 22 and a scan-path circuit 23. The scan-path circuit 23 is made up of all cascaded flip-flops F1 through Fn (n=4 in FIG. 1) of the logic circuit 21 which is subjected to the test. It should be noted that, on the input sides of the flip-flops F2 through Fn (second and subsequent stages), selectors S2 through Sn are provided, respectively.

In normal operation, in response to a clock commonly supplied from the outside to an input terminal CK, the respective flip-flops F1 through Fn fetch signals by respective inputs A1 through An and output the signals from respective outputs B1 through Bn, in repeating fashion. As a result, an arithmetic process is carried out in the combinational logic circuit 22.

Meanwhile, when conducting the test, an appropriate signal sequence is supplied to an input terminal D0, and the flip-flops F1 through Fn are caused to function as shift registers. Through the outputs B1 through Bn, the signal sequence is supplied to the combinational logic circuit 22, thereby causing the combinational logic circuit 22 to carry out an arithmetic process. Subsequently, the result of the arithmetic process is fetched through the inputs A1 through An, and the flip-flops F1 through Fn are again caused to function as the shift registers. As a result, the result of the test of the combinational logic circuit 22 is observed through the output terminal B0.

Prior to this test of the combinational logic circuit 22, the signal appearing on the input terminal C0 causes the flip-flops F1 through Fn to operate as the shift registers. In this state, a scan input is supplied from the input terminal D0 to a first-stage output D1, the scan input is serially shifted from the outputs B1 through Bn−1 to the inputs D1 through Dn−1 in the next stage. Consequently, the presence of a failure on the scan path is identified by checking whether or not the scan input is serially outputted to the outside through the last-stage output Bn and the output terminal B0.

Figure 3:
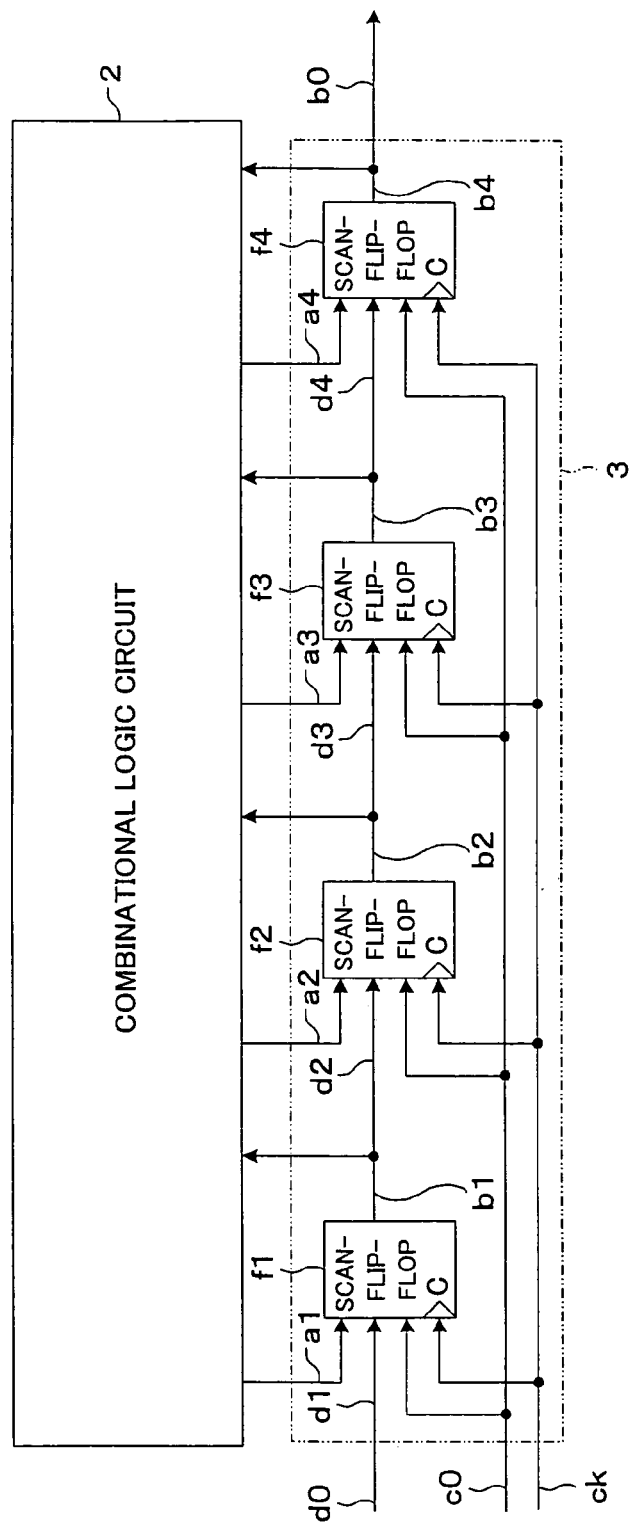
FIG. 3 is a block diagram showing circuitry of a logic circuit adopting a conventional scan design test technique.

In this manner, before being used for testing the combinational logic circuit 22, the flip-flops F1 through Fn are subjected to the test. If the test confirms that these flip-flops F1 through Fn function properly, the test of the combinational logic circuit 22 is carried out. Up to this point, the logic circuit 21 is identical in structure with the logic circuit 1 in FIG. 3 and the logic circuit 11 in FIG. 4.

However, in the present embodiment an input terminal C1 is further provided, and before the above-mentioned shifting of the scan input, the selectors S2 through Sn are switched by a control signal from the outside, causing the inputs D2 through Dn of the flip-flops F2 through Fn (second and subsequent flip-flops) to be directly connected with the input terminal D0, in a manner identical with the first-stage input D1. With this, a logical "0" or "1" is simultaneously given to all of the flip-flops F1 through Fn.

Thus, when, after giving one logic state to all flip-flops, the shifting is carried out so that the values of the flip-flops F1 through Fn are serially fetched to the outside through the output terminal B0, one value repeatedly appears in each cycle if the scan path has no failure, the number of the cycles being determined by adding one to the number of the flip-flops on the scan path. On the contrary, when there is a failure on the scan path, an expected value does not appear in the cycle corresponding to the defected flip-flop. Thus, when there is a failure on the scan path, the location of the flip-flop corresponding to the failure is specified by checking the cycles, and the number of the cycles is determined by adding one to the number of the flip-flops on the scan path.

FIG. 2 is an waveform chart for describing how a failure is detected in the above-described logic circuit 21, taking a 1-stuck-at fault in a B3 output signal line of the third-stage flip-flop F3 as an example. First, a logical "1" is set in the control input C0 so that all of the flip-flops F1 through Fn are determined to be a logical "0" by the scan input D0. Next, the control input C0 returns to a logical "0", and after the shifting, the values of the respective flip-flops F1 through Fn are observed on the scan output B0. When the scan path has no failure, a logical "0" repeatedly appears on the scan output B0. Meanwhile, when the flip-flop F3 has a failure as above, while "0" appears on the output Bn of the flip-flop Fn in the cycle 0, a logical "1" appears in the cycle 1. This specifies that the failure is in the third-stage flip-flop F3.

This example clearly shows that the present invention makes it possible to check the presence of a failure on the scan path and to specify the location of the failure, simultaneously. The longest period of time required for the test corresponds to the total of the cycles being determined by adding one to the number of the flip-flops on the scan path, and hence the present invention is suitable for a device in which a scan path is made up of a large number of stages.

Figure 4:
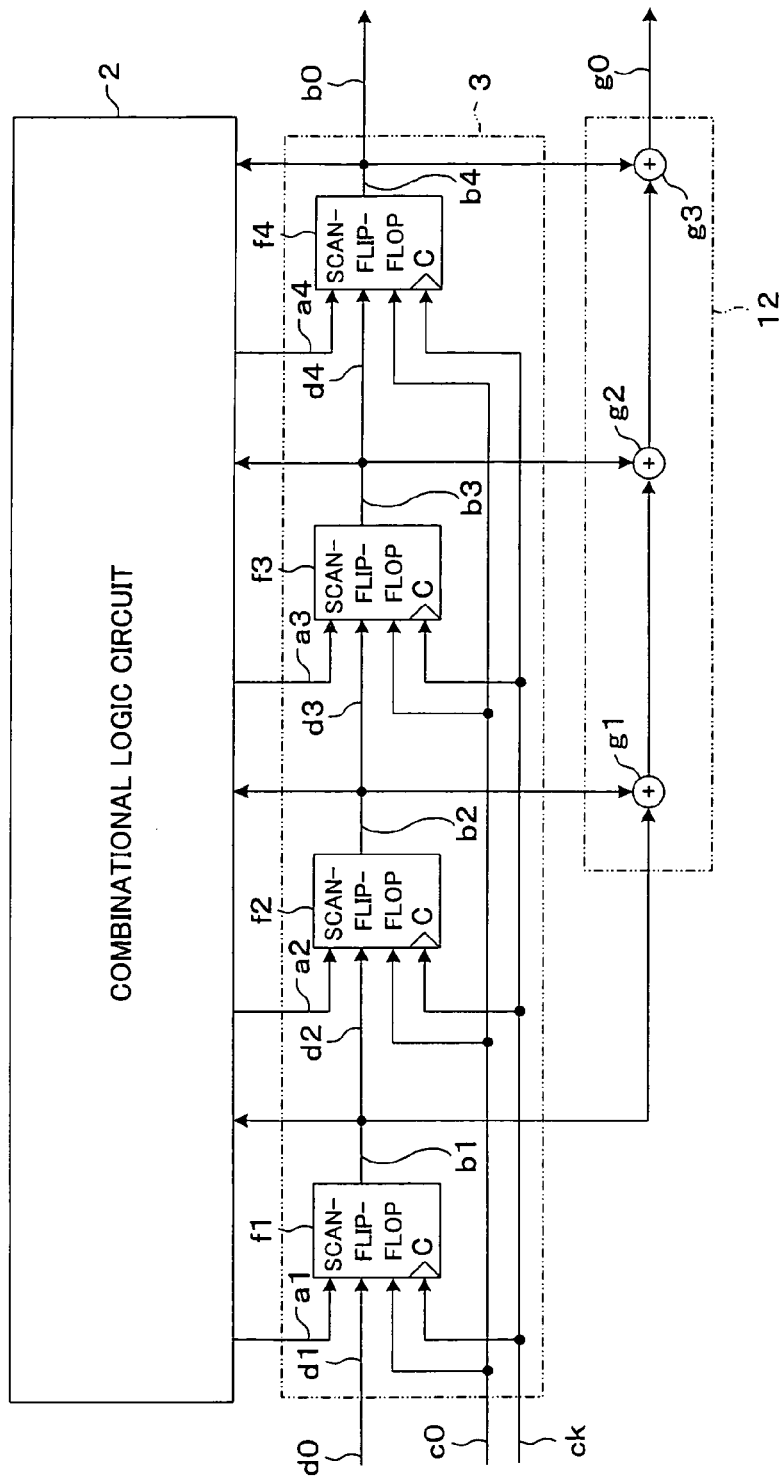
FIG. 4 is a block diagram showing circuitry of a logic circuit adopting another conventional technique.

Table. 1 shows the result of a comparison of a period of time (number of cycles) required for specifying the location of a failure in the scan-path circuit of the logic circuit 21 of the present embodiment with a period of time (number of cycles) required for specifying the location of a failure in the scan-path circuit of the logic circuit 11 shown in FIG. 4.

TABLE 1

| NUMBER OF STAGES IN ONE SCAN PATH | CONVENTIONAL ART | | PRESENT INVENTION | |
|---|---|---|---|---|
| | MINIMUM | MAXIMUM | MINIMUM | MAXIMUM |
| 4 | 7 | 10 | 2 | 5 |
| 100 | 103 | 202 | 2 | 101 |
| n | (n + 1) + 2 | 2 * (n + 1) | 2 | n + 1 |

The following shows a specific result of a test for a completely non-defective product of a conventional art with a test for a completely non-defective product of the present invention.

The comparison presupposes that the number n of the flip-flops is 5000, one cycle takes 100 nsec, and the number of test patterns in the combinational circuit 22 other than the scan-path circuit 23 is 3000.

First, according to "MAXIMUM" in the Table. 1, a test period for testing the scan-path circuit 23 is 2×(5000+1)× 2×100 nsec=2 msec in the conventional art, and is (5000+ 1)×2×100 nsec=1 msec in the present invention.

Note that, in each of these equations, the formula in the table is doubled in order to test both a 0-stuck-at fault and a 1-stuck-at fault of a signal line on the scan path. The result shows that the test period for the scan-path circuit 23 of the present invention is half as much as that of the conventional art.

This result of the comparison clearly shows that, in a scan-path test for detecting a stuck-at fault, the present invention can halve the number of cycles required for the test, thereby reducing the costs for the test.

The scan-path circuit of the present embodiment can be used for various integrated circuits including logic circuits adopting a scan design test technique, and the method described in the present embodiment is particularly effective for detecting a stuck-at fault which causes a value of the flip-flops F1 through Fn to be stuck to a particular value.

Note that, input setting means of the present embodiment is not limited to the selectors S2 through Sn which supply a scan input in a parallel manner. Thus, any types of arrangements can be adopted as long as all of the flip-flops F1 through Fn receive one value. For instance, all of the flip-flops F1 through Fn are either pulled up to the level of an output voltage of an internal power supply or pulled down to the GND level.

As described above, in a scan-path circuit of the present invention included in a logic circuit which adopts a scan design test technique for simplifying a test by serially shifting a test result through cascaded flip-flops which are in the logic circuit and constitutes the scan-path circuit, input means for causing, before carrying out the test, the inputs of the flip-flops to have identical values is provided, and after setting the values on the inputs as such, the shifting and outputting are carried out so that the location of a failure is specified.

Thus, the maximum period of time required by the test does not exceed the total of clock cycles for the shifting through all stages and one more stage, and only by adding a few terminals for setting values of the inputs, it becomes possible to specify the location of a failure and reduce the number of cycles required for detecting a failure. On this account, the analysis of a failure is carried out with ease. The present invention is particularly effective in the case of a stuck-at fault which causes a value of the flip-flop to be fixed at a particular value.

According to the above-described scan-path circuit, the input setting means are preferably selectors that are provided on input sides of the flip-flops except on an input side of a first-stage flip-flop, and directly connect the inputs of the flip-flops to a scan input.

Thus, on the occasion of carrying out the test, the selectors directly connects the inputs of the flop-flops to the scan input and causes these inputs to have identical values.

With this, the test can be carried out with a scan input having an arbitrary value.

The logic circuit of the present embodiment includes, as described above, the above-mentioned scan-path circuit.

Thus, only by adding a few terminals, a logic circuit which can specify the location of a failure with a fewer numbers of cycles is realized.

A method of the present invention, which is for testing an integrated circuit including a scan-design logic circuit, is arranged in the following manner: All flip-flops are caused to have identical values on their inputs by controlling selectors which are provided on input sides of the flip-flops except on an input side of a first-stage flip-flop, so as to directly connect inputs of all of the flip-flops to a scan input, and a scan-path circuit made up of the flip-flops carries out shifting so as to output data. If the transition of the output is observed, an occurrence of a failure is assumed, and the location of the failure is specified based on a clock cycle in which the failure occurs.

As described above, the method of the present invention, which is for testing an integrated circuit including a scan-design logic circuit, is arranged in the following manner: The logic circuit includes selectors which are provided on input sides of the flip-flops except on an input side of a first-stage flip-flop so as to directly connect inputs of all of the flip-flops to a scan input. When carrying out the test, all of the flip-flops are caused to have identical values by controlling the selectors, and the shifting and outputting are carried out. On this occasion, a transition of the output is judged as an occurrence of a failure, and the location of the failure is specified based on a clock cycle in which the transition occurs.

Thus, the maximum period of time required by the test does not exceed the total of clock cycles for the shifting through all stages and one more stage, and only by adding a few terminals for controlling the selectors, it becomes possible to specify the location of a failure and reduce the number of cycles required for detecting a failure.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A scan-path circuit included in a scan-design logic circuit, comprising:
   a plurality of flip-flops which are cascaded and constitute a scan path: and
   input setting device to set respective inputs of said plurality of flip-flops to have identical values of a selected one of one and zero to perform a scan-path test for detecting a stuck-at fault in the scan path.

2. The scan-path circuit as defined in claim 1, wherein, the input setting device includes selectors, provided on input sides of said plurality of flip-flops except on an input side of a first-stage flip-flop, and directly connect the inputs of said plurality of flip-flops to a scan input.

3. A logic circuit, comprising the scan-path circuit defined in claim 1.

4. A logic circuit, comprising the scan-path circuit defined in claim 2.

5. A method for testing an integrated circuit including a scan-design logic circuit, comprising the steps of:
   causing all flip-flops to have identical values, by controlling selectors provided on input sides of the flip-flops except on an input side of a first-stage flip-flop so as to directly connect inputs of all of the flip-flops to a scan input;
   causing a scan-path circuit made up of the flip-flops to carry out shifting and to output data; and
   detecting a failure on account of a transition of an output and specifying a location of the failure based on a clock cycle in which the failure occurs.

6. A scan-path circuit included in a scan-design logic circuit, comprising:
   a plurality of flip-flops which are cascaded and constitute a scan path: and input setting means for setting respective inputs of said plurality of flip-flops to have identical values of a selected one of one and zero to perform a scan-path test for detecting a stuck-at fault in the scan path.

7. The scan-path circuit as defined in claim 6, wherein, the input setting means are selectors that are provided on input sides of said plurality of flip-flops except on an input side of a first-stage flip-flop, and directly connect the inputs of said plurality of flip-flops to a scan input.

8. A logic circuit, comprising the scan-path circuit defined in claim 6.

9. A logic circuit, comprising the scan-path circuit defined in claim 7.

* * * * *